United States Patent [19]

Brandle, Jr. et al.

[11] Patent Number: 4,802,180
[45] Date of Patent: Jan. 31, 1989

[54] GROWTH OF CONGRUENTLY MELTING GADOLINIUM SCANDIUM GALLIUM GARNET

[75] Inventors: Charles D. Brandle, Jr., Basking Ridge; Vincent J. Fratello, New Providence; Alejandro J. Valentino, Colonia, all of N.J.

[73] Assignee: American Telephone and Telegraph Company, AT&T Bell Laboratories, Murray Hill, N.J.

[21] Appl. No.: 857,846

[22] Filed: Apr. 30, 1986

[51] Int. Cl.[4] .............................................. H01S 3/16
[52] U.S. Cl. ...................................... 372/41; 372/39; 252/301.17; 252/582
[58] Field of Search .............. 372/41; 252/582, 301.17

[56] References Cited

PUBLICATIONS

Zharikov et al., "Invest. of a New Laser Active Medium in the Form of Gadolinium Scandium Gallium Garnet Cryst. Activated with Chromium and Neodymium", Sov-Jour. Quant. Electron, 14(8), Aug. 1984.
Moulton, "New Developments in Solid-State Lasers", Laser Focus, May 1983, pp. 83–88.
Brandle, Jr. et al., "Cryst. Stoich. and Growth of Rare-Earth Garnets Containing-Scandium", Jour. of Cryst. Growth 20, (1973), pp. 1–5.
*X-Ray Diffraction Procedures for Polycrystalline and Amorphous Materials*, H. P. Klug, et al., John Wiley & Sons, New York, 1974, p. 306.
"Crystal Stoichiometry of Czochralski Grown Rare-Earth Gallium Garnets", *Journal of Crystal Growth*, vol. 26, 1974, pp. 169–170, C. D. Brandle, Jr. et al.
"An Empirical Formula for the Calculation of Lattice Constants of Oxide Garnets Based on Substituted Yttrium- and Gadolinium-Iron Garnets", *Philips Journal of Research*, vol. 33, 1978, pp. 186–202, B. Strocka, et al.
"Precision Lattice Constant Determination", *Acta Crystallographica*, vol. 13, 1960, pp. 814–818, W. L. Bond.
"Precision Lattice Constant Determination: erratum", *Acta Crystallographica*, vol. A31, 1975, p. 698, W. L. Bond.
"The Distribution Coefficient of Scandium in Czochralski Grown $Gd_3Sc_xGa_{5-x}O_{12}$ and $Y_3Sc_xGa_{5-x}O_{12}$ Garnets", *Journal of Crystal Growth*, vol. 23, 1974, pp. 58–64, K. Chow, et al.
"New Developments in Solid-State Lasers", *Laser Focus*, May, 1983, pp. 83–88, P. F. Moulton.

*Primary Examiner*—Leon Scott, Jr.
*Attorney, Agent, or Firm*—Michael J. Urbano

[57] ABSTRACT

The congruently melting composition of gadolinium scandium gallium garnet comprises $$Gd_{2.96\pm0.03}\,Sc_{1.90\pm0.05}\,Ga_{3.14+0.05}\,O_{12}.$$

The composition may be used as the substrate for magnetic bubble domain devices or, when doped with a suitable activator (e.g., $Cr^{+3}$ or $Nd^{+3}$ or both), may serve as the active medium of a solid state laser.

7 Claims, 1 Drawing Sheet

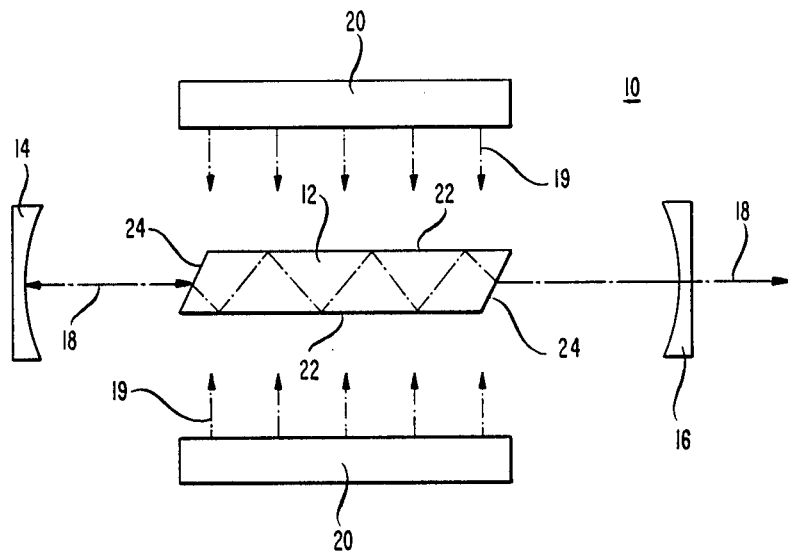

GROWTH OF CONGRUENTLY MELTING GADOLINIUM SCANDIUM GALLIUM GARNET

BACKGROUND OF THE INVENTION

This invention relates to garnet materials and, more particularly, to gadolinium scandium gallium garnet.

Garnet materials have a number of diverse technological applications. They are used, for example, as the substrate for magnetic bubble domain devices and as the host for the active light-emitting species of solid state lasers.

Gadolinium scandium gallium garnet (GSGG), which was first prepared by C. D. Brandle et al. (*Journal of Crystal Growth*, Vol. 20, p. 1, (1973)) using the Czochralski technique, recently has been used as a host material for Cr-doped tunable lasers (P. F. Moulton, *Laser Focus*, p. 83, May 1983) and for Nd:Cr-doped high power solid state lasers (E. V. Zharikov et al., *Soviet Journal of Quantum Electronics*, Vol. 14, p. 1056 (1984)). However, uniform crystals are important for laser applications. Achieving uniformity requires an accurate knowledge of the congruently melting composition; that is, the composition at which the growing crystal has the same composition as the melt from which it is grown.

The garnet structure is a complex oxide network that contains three dodecahedral, two octahedral, and three tetrahedral sites per formula unit. The natural site distribution is gadolinium (ionic radius $r_i = 1.053$ Angstrom) on the large dodecahedral site, scandium ($r_i = 0.745$ Angstrom) on the medium sized octahedral site, and gallium ($r_i = 0.47$ Angstrom) on the small tetrahedral site. However, it is known from other garnets that there can be small off-site distributions of these ions, namely: (1) Gallium is readily incorporated on the octahedral site in a variety of rare earth gallium garnets; (2) Gadolinium is incorporated octahedrally in gadolinium gallium garnet (GGG), C. D. Brandle et al., *Journal of Crystal Growth*, Vol. 26, p. 169 (1974); and (3) Scandium is incorporated dodecahedrally in gadolinium scandium aluminum garnet, C. D. Brandle et al. (1973), supra. Any or all of these mechanisms may affect the congruent composition of GSGG. The total distribution coefficients of all three components must be equal to unity to grow a crystal of uniform composition.

Previous researchers used lattice parameter measurements to determine the compositional uniformity of GSGG. Brandle et al. (1973), supra, compared their lattice parameter data to their calculated values and concluded that there must be octahedral gadolinium in these crystals. K. Chow et al. (*Journal of Crystal Growth*, Vol. 23, p. 58, (1974)) used lattice parameter data from sintered (ceramic) samples to conclude that the congruent melting composition was $Gd_{3.0}Sc_{1.6}Ga_{3.4}O_{12}$. Such determinations based on one variable are not sufficient to solve a three component system, especially with the added complication of off-site distributions of more than one ion. Consequently, we have determined that the Chow et al. congruent melting composition is inaccurate and that GSGG crystals grown in reliance on it suffer from considerable lack of uniformity.

SUMMARY OF THE INVENTION

In accordance with one aspect of our invention, the congruently melting composition of GSGG single crystals comprises $$Gd_{2.96 \pm 0.03}Sc_{1.90 \pm 0.05}Ga_{3.14 \pm 0.05}O_{12}. \quad (1)$$

A preferred composition determined via X-ray fluorescence comprises $Gd_{2.957}Sc_{1.905}Ga_{3.138}O_{12}$ or, expressed on a site-by-site basis, comprises $$\{Gd_{2.957}Sc_{0.043}\}[Sc_{1.862}Ga_{0.138}](Ga_{3.000})O_{12}, \quad (2)$$

where the braces denote the dodecahedral sites, the brackets denote the octahedral sites, and the parentheses denote the tetrahedral sites. The presence of 0.043 formula unit of dodecahedral Sc was unexpected and plays an important role in reducing the lattice parameter of the GSGG single cyrstals.

Good quality, highly uniform single crystals of suitable quality for active media of solid state lasers or for substrates of bubble domain devices have been prepared. The laser material was grown with suitable concentrations of $Nd^{+3}$ and $Cr^{+3}$ to produce stimulated emission at about 1.06 μm from the $Nd^{+3}$ activator. Nd:Cr-doped GSGG crystals grown using our composition show improved optical quality and hence better laser performance. In addition, fabrication of large slab lasers (e.g., $10 \times 20 \times 1$ cm) is realizable because of the uniform optical quality of our material.

Another advantage of our invention is that utilization of the melt (i.e., the fraction of the liquid melt crystallized) is significantly increased from the prior art 30 to 40 percent to a value of 80 to 90 percent. This increased yield implies lower unit costs.

In accordance with another aspect of our invention, the congruent melting composition of GSGG is prepared by a Czochralski growth process which includes pre-heating of compacted oxide powders of the GSGG constituents at an elevated temperature (e.g., about 900°–1700° C.) below the melting point to chemically bind the gallium oxide into low vapor pressure phases, thus reducing gallium oxide evaporation at the relatively high temperatures (e.g., about 1875°–1900° C.) required to melt this garnet material.

BRIEF DESCRIPTION OF THE DRAWING

Our invention, together with its various features and advantages, can be readily understood from the following more detailed description, taken in conjunction with the accompanying drawing, in which the sole FIGURE is a schematic of a solid state slab laser in accordance with one embodiment of our invention.

DETAILED DESCRIPTION

Turning now to the FIGURE, there is shown an illustrative solid state laser 10 comprising a solid active medium 12 dispoesd along the axis of a cavity resonator formed by a pair of separated, concave reflectors 14 and 16. Typically, reflector 14 is nearly 100 percent reflective whereas reflector 16 is partially transmissive to allow egress of a useful output light beam 18. Pumping energy is supplied to the active medium 12 in order to create a population inversion therein by pumping means 20 well known in the art. The energy is often provided by electromagnetic waves 19 in the optical portion of the frequency spectrum. Thus, pumping means 20 may be a flashlamp or a laser which generates optical radiation of a wavelength which is absorbed in the active medium and of an intensity sufficient to create a population inversion. A flashlamp pumping means is typically employed for high power, pulsed operation whereas laser pumping means is typically used for lower power, continuous wave (CW) operation. In the pulsed mode, the active medium typically has the shape of a cylindrical rod, but in the CW case its shape is that of a slab; i.e., a rhombohedron with parallel major surfaces 22 through which the pumping radiation is absorbed and parallel end surfaces 24 through which the lasing light enters and exits the active medium 12. The end surfaces 24 are oriented at Brewster's angle to the major surfaces 22. Within the medium 12 the lasing radiation propagates along a zig-zag path caused by total internal reflection at the major surfaces 22.

In accordance with one embodiment of our invention the active medium 12 comprises a GSGG single crystal host doped with suitable activators, and the host has a congruently melting composition given by $$Gd_{2.96 \pm 0.03} Sc_{1.90 \pm 0.05} Ga_{3.14 \pm 0.05} O_{12}. \qquad (3)$$

In a preferred embodiment, the host comprises $$Gd_{2.957} Sc_{1.905} Ga_{3.138} O_{12}. \qquad (4)$$

Suitable activators are many depending on the desired wavelength of operation. For example, when $Cr^{+3}$ is used as the activator, the laser emits at about 745-820 nm. But, when $Nd^{+3}$ and $Cr^{+3}$ are used, the laser emits at 1.06 μm characteristic of $Nd^{+3}$, and the $Cr^{+3}$ serves to enhance the efficiency of absorption of the pumping radiation and to transfer the pumping energy to the $Nd^{+3}$ upper laser level.

Because our congruently melting composition enables the growth of optically uniform single crystal boules, relatively large (e.g., 10×20×1 cm) slabs, with optically uniform characteristics throughout, can be cut from the boules and used as active media for solid state lasers with enhanced performance.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, our congruently melting composition of GSGG may be used as the substrate of a magnetic domain device as described by Brandle et al. (1973), supra. Briefly, an epitaxial layer of a magnetic garnet is grown on the substrate, and a suitable electrode pattern is formed on the epitaxial layer to control the propagation of magnetic bubble domains therein.

EXAMPLE

This example describes the conditions for reproducible growth of GSGG single crystals of predetermined composition by a modified Czochralski technique. X-ray fluorescence (XRF) was used to examine the compositional uniformity of these crystals, and that data was used to determine the congruent melting composition. Various materials, parameters, equipment etc. are identified by way of illustration only and, unless otherwise stated, are not intended to limit the scope of the invention.

Initially, a stoichiometric sintered (i.e., ceramic, non-single crystalline) sample of $Gd_{3.0}Sc_{2.0}Ga_{3.0}O_{12}$ was prepared to determine the lattice parameter of stoichiometric GSGG and for use as an XRF standard.

Next, single crystals were grown from an rf heated iridium crucible by the well-known Czochralski technique. The charges comprised 350 g of pre-dried $Gd_2O_3$, $Sc_2O_3$, and $Ga_2O_3$ that had been mixed and pressed into a compact. If the crystal is to be doped, then a pre-dried oxide of the desired dopant (e.g., $Cr_2O_3$, $Nd_2O_3$) would be mixed into the charges. In accordance with one aspect of our invention, the basic Czochralski technique was modified by pre-firing the pressed powder at about 1100° C. overnight for reasons discussed later. A suitable range is about 900°-1700° C. for about 4-24 hours. The charges melted at a temperature of 1875° C. and were held there for at least one hour before beginning growth. A suitable range is about 1875°-1900° C. for about 1-3 hours. All crystals were grown along a (111) direction from a GSGG seed. A linear growth rate of 3.8 mm/hr and a rotation rate of 40 rpm produced a single crystal boule about 23 mm in diameter. The growth rate and rotation rate, however, are not critical.

To be certain of the sample composition, it was important to reduce possible sources of sample weight loss, which included: (1) Adsorbed moisture and gases. If the oxides are not pre-dried at high temperatures, this adsorption can be a substantial source of compositional error. In particular, the $Sc_2O_3$ lost 4 percent of its weight after an overnight bake-out. Drying at a temperature of about 1100° C. appeared to remove all adsorbed gases; (2) $Ga_2O_3$ evaporation. Since growth of GSGG is carried out at higher temperatures than that of GGG, the evaporation of gallium oxide is a more substantial problem in GSGG. For the growth of GGG an atmosphere of 2 percent oxygen in 98 percent nitrogen is sufficiently oxidizing to suppress the evaporation of $Ga_2O_3$. This atmosphere was used by previous researchers for the growth of GSGG. We found, however, than an atmosphere of 3 percent oxygen and 97 percent nitrogen by volume was more effective in suppressing $Ga_2O_3$ evaporation from the GSGG melt to below the limit of detection. Unfortunately, this relatively high oxygen concentration results in some oxidation and evaporation from the iridium crucible. However, the rate of this process can be calibrated and hence accounted for. It is also possible that gallium oxide may evaporate from the pressed powder sample before melting occurs. To reduce such evaporation, we pre-fired the pressed powder overnight at 1100° C., as discussed above, to chemically bind the $Ga_2O_3$ into low vapor pressure phases; e.g., $GdGaO_3$ $Gd_4Ga_2O_9$, $Gd_6Ga_2O_{12}$, $Gd_3Ga_5O_{12}$, and Ga-Sc oxides; (3) Sample flaking. A persistent and irregular source of sample weight loss seemed to arise from flaking of the tall pressed powder charges during melting. If the sample is taller than the crucible (as generally occurs for low density, pressed powders), then these flakes can fall outside the crucible. Therefore, melting was done in two stages (melting half of the sample, then adding the rest) to assure that the sample did not extend above the top of the crucible.

When these procedures were followed, we achieved reproducible samples of known composition with no observable garnet weight loss. To increase the effect of any non-unity distribution coefficients the largest possible fraction of each melt was grown into the crystal (generally about 90 percent). Slices were cut from the top and bottom of each boule and were polished. The composition $Gd_xSc_yGa_zO_{12}$ of each slice was determined using XRF and well-known calculations. The XRF data and calculations of x, y and z were used to iteratively vary the GSGG melt composition until the top and bottom slices from the boule had the same composition, thus indicating that all distribution coefficients were unity to within the limits of measurement accuracy.

The boules grown from melts of stoichiometric and congruent compositions were sliced lengthwise, polished, and examined in a polariscope. Birefringence photographs clearly showed the strain associated with the growth striations and faceting at the growth interface in the stoichiometric boule. Also evident at the bottom of the crystal grown from a stoichiometric melt were areas of high dislocations and inclusions resulting from the breakdown of the growth interface. In contrast, birefringence photographs showed much less strain in the boule grown from our congruent melt composition. Some strain was seen near the top of the crystal where the interface became flat and also near the bottom of the crystal resulting from faceting on the growth interface. Growth striations, although still present, were significantly reduced in intensity and could be clearly seen only near the end of the crystal. No evidence of interface breakdown, as seen in the stoichiometric crystal, was observed despite the fact that greater than 90 percent of the liquid melt was crystallized.

In general, our technique enables 80–90 percent of the melt to be crystallized, whereas prior procedures achieved only about 30–40 percent usage. This increase, of course, implies greater yield from a given melt and hence a lower unit cost. The preferred congruent composition proved to be equation (4), or, expressed on a site-by-site basis equation (2), but closely related compositions are also essentially congruent if they fall within the ranges given by equations (1) and (3). The presence of 0.043 formula unit of dodecahedral Sc (equation (2)) was unexpected. Dodecahedral Sc had been seen in gadolinium scandium aluminum garnet by Brandle et al. (1973), supra, but it had not been observed in GSGG. On the contrary, it was predicted by Brandle et al. (1974), supra, that some gadolinium would be incorporated octahedrally as in GGG, resulting in a Gd content x >3.0 per formula unit, as discussed in Brandle et al. (1973), supra.

The lattice parameter of the sintered stoichiometric sample was determined using the method described by H. P. Klug and L. E. Alexander in *X-ray Diffraction Procedures for Polycrystalline and Amorphous Materials*, 2nd ed., John Wiley Sons, New York, p. 306 (1974). The measured value of 12.583±0.001 Angstrom is consistent with the value 12.58 Angstrom determined by Chow et al., supra, and the value (12.587 Angstrom) that can be calculated by the method of Strocka et al., Philips Journal of Research, Vol. 33, p. 186, (1978), but is considerably higher than the stoichiometric value of 12.554 Angstrom calculated by Brandle et al. (1973), supra, and explains why our conclusions differ from theirs.

The lattice parameter of the XRF slices was determined using the method described by W. L. Bond in *Acta Crystallographica*, Vol. 13, p. 814 (1960) and *Acta Crystallographica*, Vol. A31, p. 698 (1975). The lattice parameter of our congruent melting compound of equations (2) and (4) is 12.560 Angstrom and is 0.023 Angstrom lower than the stoichiometric value. This result compares well with the difference of 0.020 Angstrom calculated from the composition by the method of Strocka et al., supra, and confirms the presence of dodecahedral Sc.

The density of the top of one sample was measured by weighing the sample in air and in carbon tetrachloride. The data was consistent with the presence of dodecahedral Sc. The measured value of 6.448±g/cm$^3$ was quite close to the value calculated from composition and lattice parameter data (6.441 g/cm$^3$).

What is claimed is:

1. A congruent composition of matter comprising a single crystal having a formula given by $$Gd_{2.96\pm0.03}Sc_{1.90\pm0.05}Ga_{3.14\pm0.05}O_{12},$$

wherein the crystal includes off-site distributions of more than one cation.

2. The congruent composition of claim 1 having the formula $$Gd_{2.957}Sc_{1.905}Ga_{3.138}O_{12}.$$

3. The congruent composition of claim 1 wherein said crystal is doped with a light-emitting activator.

4. The congruent composition of claim 3 wherein said activator comprises $Cr^{+3}$ ions.

5. The congruent composition of claim 3 wherein said activator comprises $Nd^{+3}$ ions.

6. The congruent composition of claim 4 wherein said crystal is also doped with $Cr^{+3}$ ions.

7. A solid state laser comprising
   means forming an optical cavity resonator,
   an active medium located within said resonator said medium comprising a crystal according to any one of claims 3, 4, 5 or 6,
   means for supplying pumping energy to said medium to generate a population inversion therein and stimulated emission of optical radiation therefrom, and
   means for providing egress of a portion of said radiation from said resonator.

* * * * *